United States Patent [19]

Boston

[11] Patent Number: 4,942,304
[45] Date of Patent: Jul. 17, 1990

[54] ION IMPLANTATION

[75] Inventor: Malcolm E. Boston, Cambridge, United Kingdom

[73] Assignee: Tecvac Limited, United Kingdom

[21] Appl. No.: 197,408

[22] PCT Filed: Sep. 30, 1987

[86] PCT No.: PCT/GB87/00691
§ 371 Date: May 24, 1988
§ 102(e) Date: May 24, 1988

[87] PCT Pub. No.: WO88/02589
PCT Pub. Date: Apr. 7, 1988

[30] Foreign Application Priority Data

Sep. 30, 1986 [GB] United Kingdom ............... 8623453

[51] Int. Cl.⁵ .......................................... H01J 37/317
[52] U.S. Cl. .............................. 250/492.3; 250/423 R; 250/454.1; 315/111.81
[58] Field of Search ............... 250/492.3, 492.2, 453.1, 250/454.1, 423 R; 315/111.81

[56] References Cited

U.S. PATENT DOCUMENTS 3,784,858  1/1974  Franks .................. 250/423 R
4,128,765 12/1978  Franks .................. 250/442

OTHER PUBLICATIONS

Brochure describing "Tecvac 221 Ion Implanter," published by Tecvac Limited, Cambridge, England.

Primary Examiner—Jack I. Berman
Attorney, Agent, or Firm—Watson, Cole, Grindle & Watson

[57] ABSTRACT

A moveable ion source is provided in apparatus for ion implantation to enable ions to be directed from different directions onto bulky target objects. The ion source may be connected on the outside of a vacuum chamber or on a mobile arm within it.

The ion source is supplied with both gas and electricity via a single cable. The supply cable has a multi-layered structure with gas flow being supported through a relatively thin inner tube which also carries the h.t. transmission and return conductors. A relatively thick tube is provided around the inner tube to insulate the transmission and return conductors from an earth conductor and to provide mechanical strength. A special coupling is used to interconnect the supply cable with the ion source housing.

12 Claims, 6 Drawing Sheets

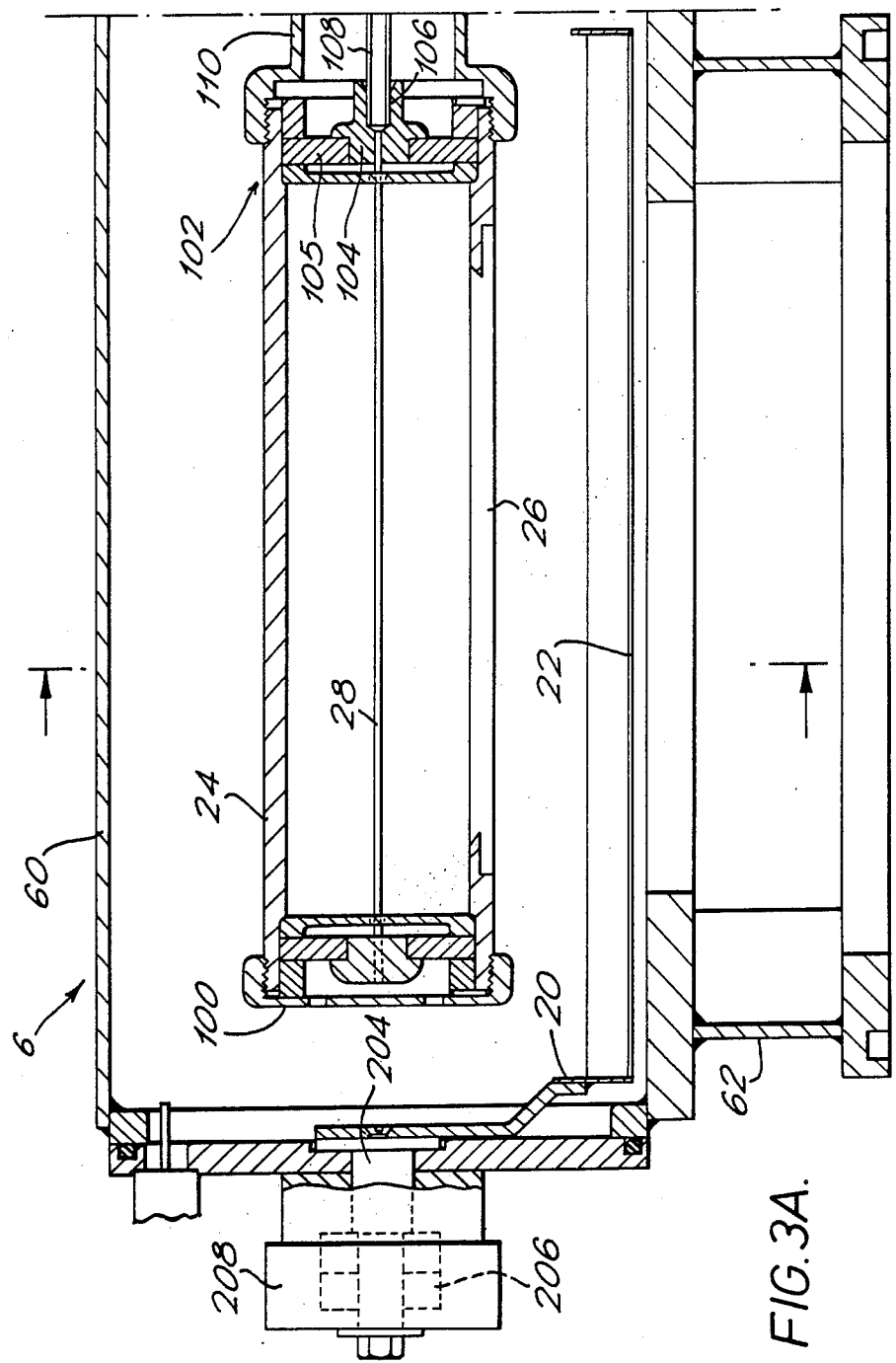

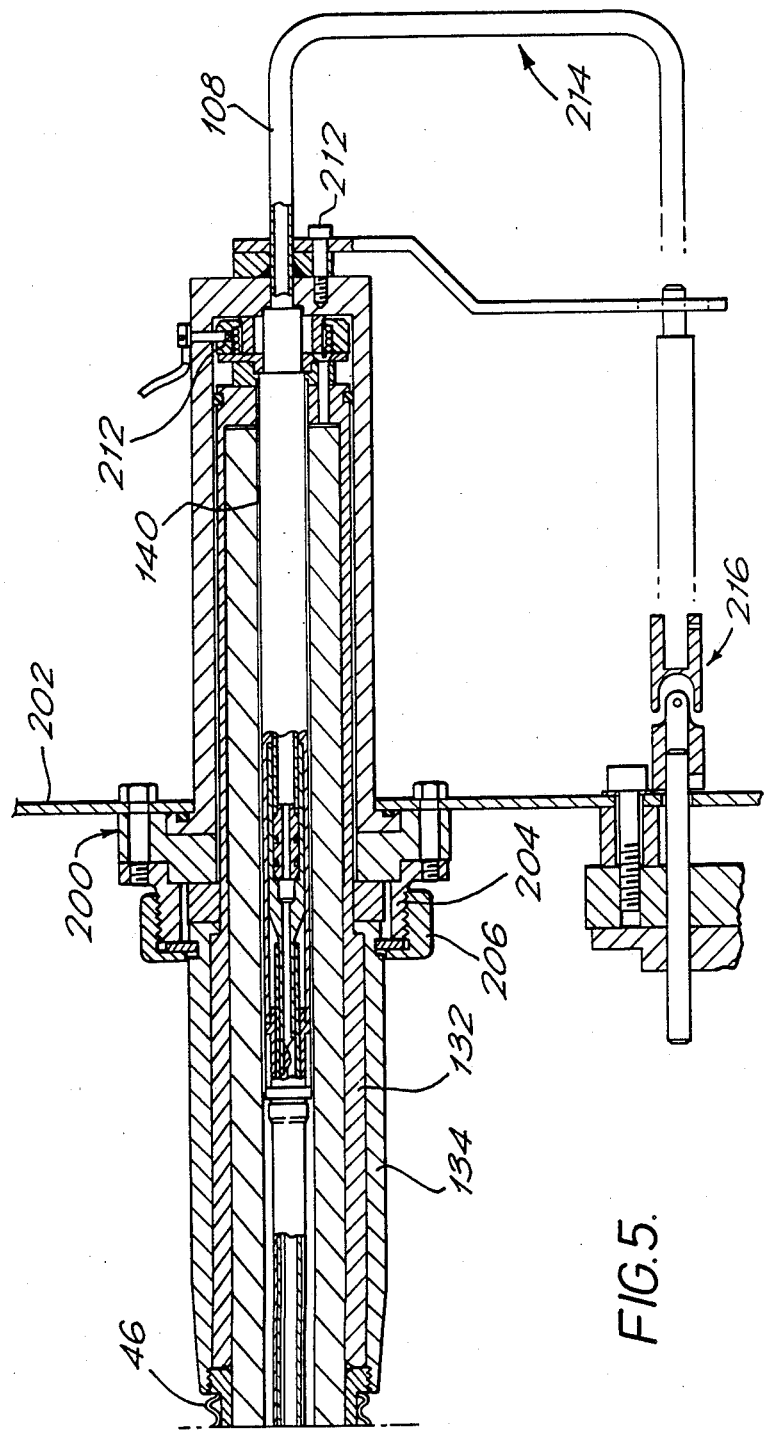

ION IMPLANTATION

FIELD OF THE INVENTION

This invention relates to apparatus for ion implantation.

THE PRIOR ART

Ion implantation is a process employed in the semiconductor industry for doping integrated circuits and semiconductor substrates. The process has been adapted to implant ions into engineering components since it has been found that for example the hardness and corrosion resistance can be increased and component wear can be reduced by implanting high energy ions into the surface.

Since it is essentially a line of sight process, problems can arise in implanting surfaces of engineering components as they often have projections or recesses so requiring complex manipulation in 3 dimensions so as to produce uniform or sometimes selective treatment under the beam.

The same problem hardly arises with semiconductor wafers since these mainly call for a predictable and uniform dose over each unit of the whole surface, thus requiring a programmed movement about cartesian or polar co-ordinates but essentially on the 2 dimensions of a plane surface.

Thus, with complex surfaces, merely rotating the component may not be sufficient to ensure proper treatment. In addition, heavy or large objects may add a further complication, in that it may not be practicable to manipulate them under the beam because of their sheer size or weight.

It is an object therefore of the present invention to provide an ion implantation apparatus which reduces such problems of treating 3 dimensional surfaces of engineering components.

SUMMARY OF THE INVENTION

The general concept of the invention is to provide ion implantation apparatus comprising a vacuum chamber and an ion source mounted within the chamber or outside the chamber in order to direct a beam of ions at an engineering component disposed within the chamber from various directions.

So as to improve the mobility of the ion source, it is connected to a flexible cable member which supplies electrical power at a high voltage and a flow of gas to be ionized within the ion source to produce the required ions. The single cable is the only item coupled to the ion source, and this makes it a relatively simple procedure to move the ion source.

Where the ion source is mounted against the outside of the chamber, it is preferably secured at a selected one of a plurality of possible positions in order to direct the beam from one of a plurality of alternative directions.

Where the ion source is mounted within the chamber, the ion source is desirably mounted on a mobile arm or boom within the vacuum chamber with the flexible cable extending through the wall of the chamber via a suitable entry point such as a bulkhead. Preferably, movement of the arm is remotely controllable, by a computer or manually (e.g., using a joystick), thus obtaining a robotic arm.

Clearly with such a cable, problems arise as to its connection with the ion source and in particular to ensuring an hermetic seal with the ion source robust enough to withstand the various stresses and strains set up during movement of the ion source and which will provide adequate electrical isolation under normal operating conditions. Further, it is desirable that the cable be easily disconnectable from the source in order, for instance, to permit checking at intervals for vacuum tightness of the various component parts or to facilitate its movement and relocation in another position.

Accordingly, therefore, in a first aspect of the invention there is provided ion implantation apparatus including a vacuum chamber, an ion source which can be selectively disposed at one of various positions on the housing of the chamber, and a flexible cable connected to the ion source, the flexible cable comprising first and second co-axial members, the first member being disposed within the second member, and the first member comprising a first relatively thin insulating tube member and a transmission and a return conductor for conducting electrical power at a high voltage to the source, and the first tube member being coupled to a source of gas so that gas for ionization can flow through the tube member, and the second co-axial member being spaced from the first co-axial member and comprising a second relatively thick insulating tube member and an earth conductor, the second tube member providing adequate insulation between the earth conductor and the transmission and return conductors and the second co-axial member providing a sufficient mechanical strength to withstand the major part of the stresses to which the cable will be subjected.

By providing a cable of such construction, it can be ensured that the major electrical and mechanical stresses are taken by the second co-axial member whereas the important electrical and gaseous connections can be made by means of the first co-axial member which is not subject to such stresses. In addition, for added strength and safety the cable can be protected with an outer plastic sleeve, which will absorb part of the major electrical and mechanical stresses.

As preferred the electrical conductor supplying power to the source is disposed within the first tube member exposed to the gas flow, so that the gas surrounding the conductor is maintained at the same high voltage from one end to the other end and is not subject to an electrical field which would cause ionization within the first tube member and ultimately damage it. Preferably the return electrical conductor is braided around the exterior of the first thin tube.

At the end of the cable opposite to the ion source the first tube member is desirably connected to a controllable inlet valve (generally needle valve) also maintained at high voltage. The valve is connected to the gas supply at above atmospheric pressure by an insulated hose of sufficient length to prevent an electrical discharge passing down inside the hose.

Maintaining the gas at the high voltage of the transmission conductor avoids certain problems. In operation the high voltage is first applied to the ion source, after which a supply of the chosen gas is admitted through the needle (or other controllable) valve, and a discharge creates a plasma of gaseous ions (generally nitrogen) and electrons inside the ion source. Some of these are extracted and accelerated to high energy for the treatment.

If the needle valve were to be connected not to the high voltage but at some part of the gas supply at earth or a lower potential (the ion source) being at high voltage positive the gas would then pass from earth to high voltage, i.e., through an electric field from one potential to another.

During operation under such circumstances the gas would be falling in pressure and at some stage it would be at such a pressure and under such an electric field that an intense and damaging electric discharge would occur.

Positioning the needle valve at the high voltage overcomes this problem. Where the pressure is reducing, i.e., downstream of the needle valve, and where a discharge might otherwise occur, the gas is maintained in a region free of longitudinal electrical fields—so no discharge can occur. A discharge does not form in the supply line connecting the needle valve to the gas supply as it is always above atmospheric pressure.

It will also be seen that if the cable is to be co-axial and if it is to carry gas and a high voltage to the ion source, then the valve must be placed at the end of the cable remote from the ion beam source and connected directly to the HT supply, i.e., within the HT supply unit. Placing the valve at the ion source end makes the design cumbersome and impractical.

Accordingly, in a second aspect of the invention there is provided ion implantation apparatus comprising an ion source, a high tension voltage supply, and a flexible cable interconnecting the ion source with the voltage supply, the cable including a tube member carrying an electrical conductor maintained at a high tension voltage and gas for ionisation by the ion source in contact with the electrical conductor, and including a valve for regulating the flow of gas between a source of gas and the flexible cable, the valve being positioned within the voltage supply and maintained at the high tension voltage.

It is a further object of the invention to provide a connection of a flexible cable to an ion source which is of a simple nature but which permits the cable to be easily disconnected from the source in order to permit checking for vacuum tightness.

Accordingly, in a third aspect the invention provides ion implantation apparatus including a coupling for a cable, the cable being of two-part construction comprising a first inner co-axial member disposed within a second outer co-axial member, the first co-axial member comprising a first relatively thin insulating tube member carrying electrical leads for conduction of electrical power at a high voltage to the ion source and being connected to a source of gas so that gas flows along the first tube member to the ion source where it is ionized and the second co-axial member comprising a second relatively thick tube member, the coupling comprising a third tube member arranged to receive as a sliding fit the end of the second tube member to provide a support for the cable end and the coupling comprising a fourth tube member arranged for insertion within the end of the first tube member as a push fit whereby to make electrical connection with the electrical leads so that electrical power is conducted through the fourth tube member and so that gas can flow along the fourth tube member to the ion source.

The coupling may be arranged as a feedthrough between the cable and the ion source housing or alternatively as a feedthrough between the cable and the housing of an HT voltage supply.

There is thus provided a simple connection for the cable involving preparing the end of the cable and then inserting into the first thin tube member the fourth tube member of the coupling thereby to make the required electrical and gaseous connection and then inserting the second tube member as a force fit within the third tube member of the coupling to support the cable end. Thus when it is required to disconnect the cable for vacuum checks, the cable may be pulled out of the coupling relatively easily.

As a further feature of the invention, the ion source is rotatable relative to its support so that the ion beam can shifted in direction within an arc subtended from the ion source. As preferred, the ion source is bodily rotatable within a stationary housing. As preferred, the ion source is mounted to an end of the third tube member which serves as the support for the ion source, and the third tube member is journalled for rotation about its axis relative to the ion source housing. This ensures that the coupling between the cable and the ion source is maintained despite rotation of the ion source. Thus the coupling serves as a rotary feedthrough.

Where the ion source housing is clamped to a selected position on the wall of the vacuum chamber, the cable is connected directly to the coupling serving as a rotary feedthrough, but where the ion source is movable on a mobile arm or boom within the housing, two separate cable lengths are desirably provided, an external length coupled to a feedthrough on the wall of the vacuum chamber and an internal length coupled between the feedthrough and a coupling of the ion source housing. In this latter case, the coupling of the ion source housing is constructed in accordance with the invention. The feedthrough on the wall of the housing may similarly be constructed in accordance with the invention in order to receive separately the ends of the internal and external cable lengths. Such feedthrough may be rotatably mounted in the wall of the chamber. It may be mounted in the bottom wall or roof of the evacuated chamber, and is conveniently contained in a recessed housing or bulkhead so as to occupy minimal space within the chamber.

A preferred embodiment of the invention will now be described with reference to the accompanying drawings.

BRIEF DESCRIPTION OF THE DRAWINGS

FIGS. 3A and 3B show in side elevation a longitudinal cross-sectional view of the cable of FIG. 2, plunged into a rotary feedthrough coupling the cable to an ion source;

FIG. 5 shows in side elevation a longitudinal cross-sectional view of the end of the supply cable coupled to an HT supply.

DETAILED DESCRIPTION OF THE PREFERRED EMBODIMENT

Figure 1:
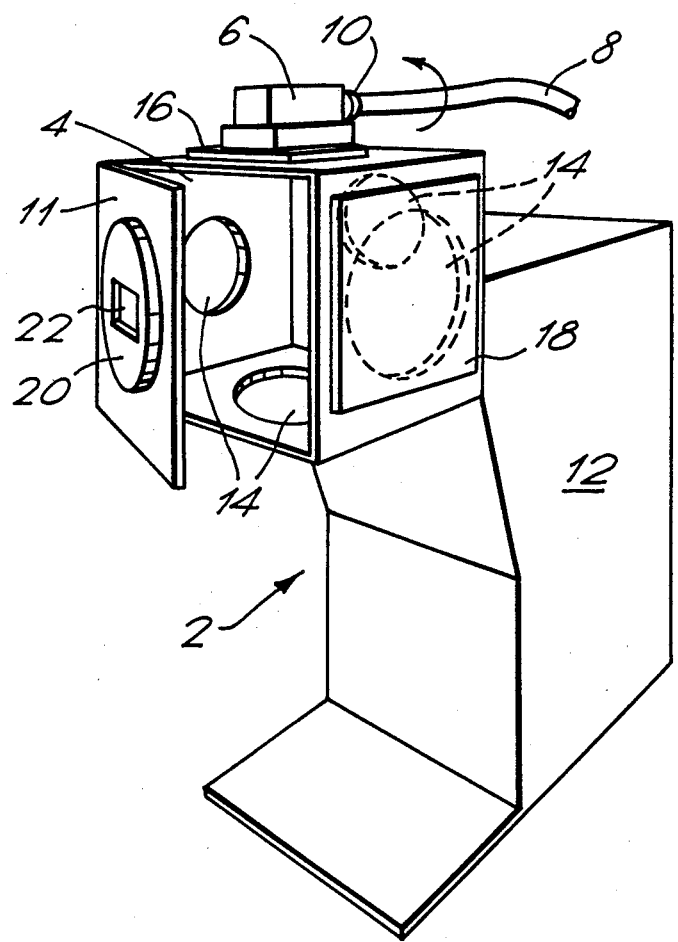
FIG. 1 shows an ion implantation machine in schematic form embodying the cable and rotary feed through of the present invention.

Referring to FIG. 1, there is shown an ion implantation machine 2 having a vacuum chamber 4, an ion source housing 6, a supply cable 8, and a rotary feedthrough 10 connecting the cable to the ion source housing. Chamber 4 has a hinged door 11 so that one or more engineering components to be treated by the ion implantation machine can be placed in the chamber 4. A suitable means for holding the engineering components (not shown) is provided. The body of the machine 12 contains a vacuum pumping system and equipment for creating and maintaining a vacuum in the chamber 4 and if necessary cryo-pumping equipment to reduce the residual water vapour content.

Each wall of the chamber, including the side walls, the top and bottom walls and the door wall has a circular port 14. The ion source housing has an adaptor and coupling plate 16 to connect the housing to one of the ports by suitable fittings. As will be described below in greater detail, the housing incorporates an isolation valve so that the ion source can be held under vacuum independently of the vacuum chamber, the valve being opened only when the vacuum chamber is being evacuated preparatory to ion implantation. This is a safety measure and also maintains the ion source in a clean condition, out of contact with the moisture containing atmosphere and reducing the opportunity for contamination by human touch. Thus, the ion source and its housing are self-contained and may be selectively connected to any of the ports 14. The remaining ports are sealed off with blanking plates 18. The blanking plate 20 for the door incorporates a window 22 so that the operator can view the component being implanted. Thus the ion source with its housing may be positioned optionally relative to the component within the vacuum chamber.

As an alternative, a plurality of ion sources may be fitted to different ports and simultaneously or sequentially used to treat engineering components within the chamber from different directions.

The ion source may be rotated through an angle by rotating the feedthrough 10 with the axis of rotation being along the axis of the cable 8 to permit further adjustment of the ion beam direction.

Figure 3B:
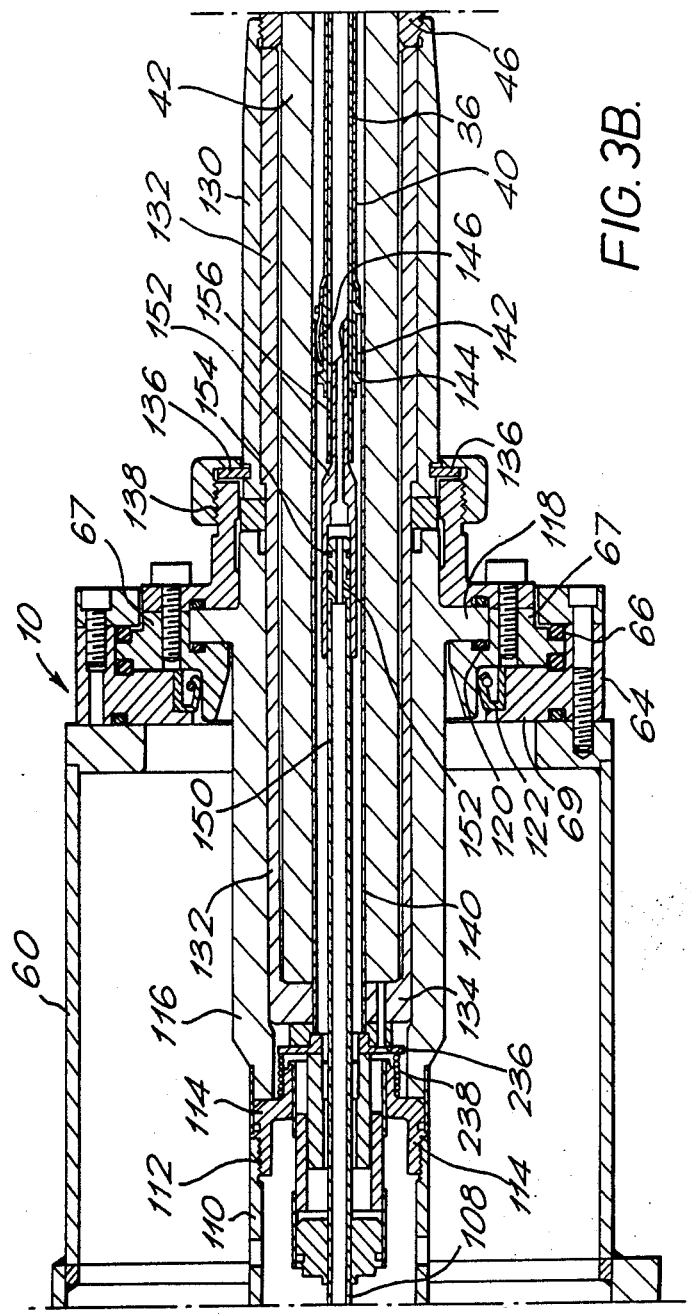
Figure 4:
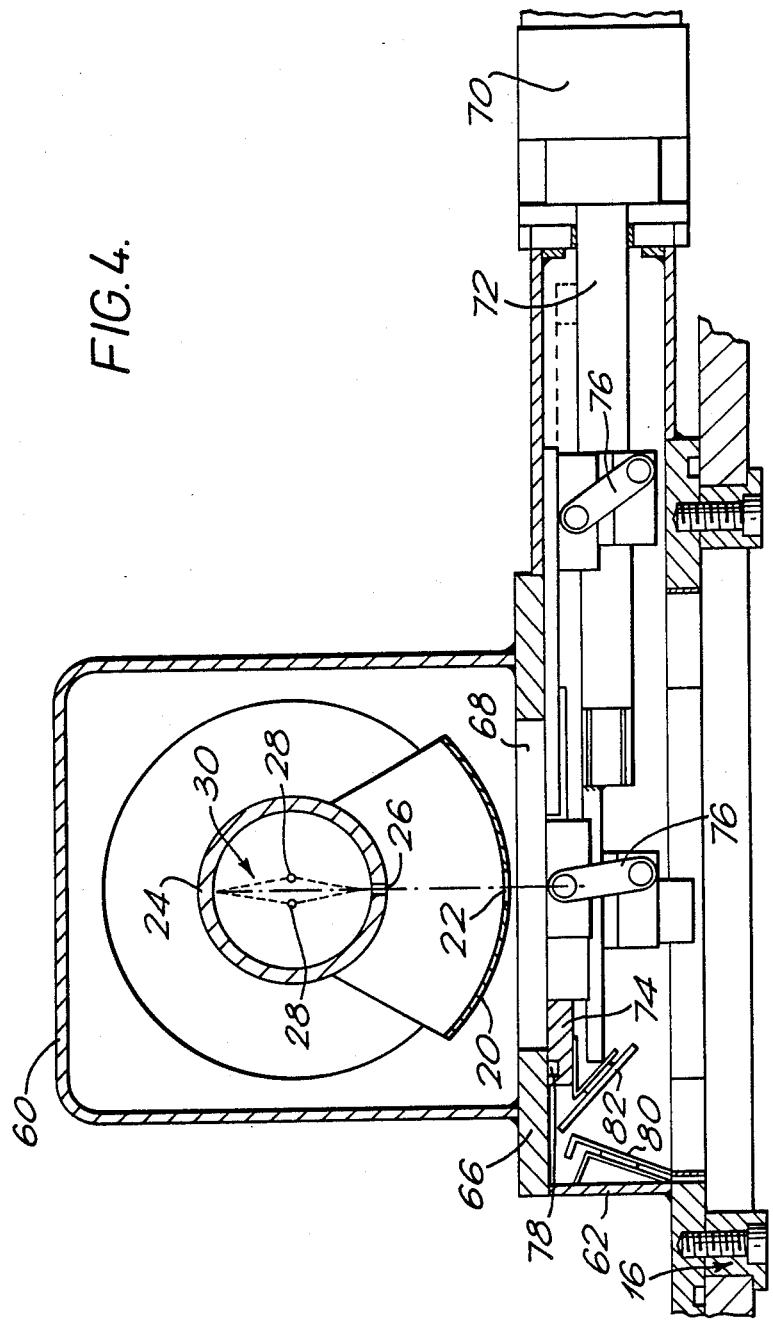
FIG. 4 shows in end elevation a cross-sectional view of the ion beam source.

The ion source is shown in more detail in FIGS. 3 and 4 and comprises an outer steel earthed electrode member 20 having a slit 22 for the ion beam, an inner graphite tube 24 similarly having an ion slit 26 for the ion beam mounted within the outer tube and a pair of tungsten anodes 28 between which a high frequency plasma of ions and electrons is created. The inner tungsten electrodes 28 are normally at 100 kv positive and the graphite tube 24 is at 90 kv positive. The intense plasma of gaseous ions (e.g. nitrogen) and electrons is created as shown at 30 is essentially planar in form along the length of the electrodes. The graphite tube contains the plasma and ions emerging through the slit 24 are extracted to be accelerated across the gap separating the graphite tube 24 and the earth electrode member 20.

Figure 2:
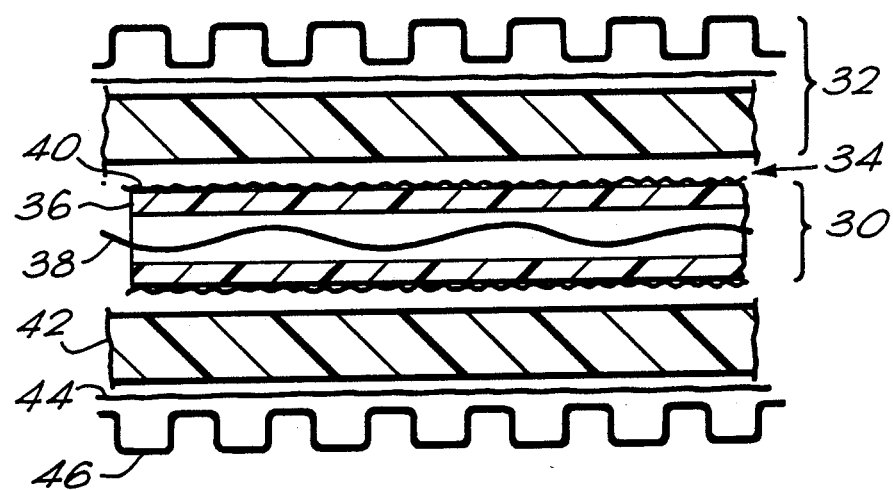
FIG. 2 shows a fragmentary view of the cable according to the invention in longitudinal section.

Referring now to FIG. 2, there is shown the flexible cable according to the invention being essentially in two-part form comprising a first inner tubular co-axial member 30 and a second outer tubular co-axial member 32 spaced from the inner co-axial member by a space 34. The first inner co-axial member comprises a polymer tube 36 which is 0.8 cm in outer diameter and has a wall thickness of 0.3 cm. An inner electrical conductor 38 provides electrical power at 100 kv to drive the plasma in the ion source and comprises a braided copper wire loosely disposed within the tubular member 36. A copper braid 40 surrounds the tubular member 36 and serves as a return conductor for conducting electrical current at 90 kv from the ion source. As an alternative construction, conductor 38 may be replaced by a small bore copper tube carrying the nitrogen gas.

The second outer tubular member 32 comprises a tubular member 42 of an elastic material such as SILASTIC, or natural, rubber having an outer diameter of 3.5 cm and a wall thickness of 1.1 cm. The inner and outer surfaces of the tube 42 are covered with a coating of AQUADAG (Trade Mark) colloidal graphite. A further copper braid 44 surrounds the elastic tube and serves as an earth conductor. An outer plastics sleeve 46 is provided as a protective member having radial corrugations to allow flexing movement during the movement of the cable.

The cable is of a length long enough (e.g. several meters) to enable it to be connected between an HT supply (oil immersed or air insulated), the HT supply also containing a gas supply regulating valve, and the ion beam source, no matter at which position the ion beam source is mounted. The cable is connected to the gas so that the gas flows within the inner tubular member and exposed to conductor 38.

Referring now to FIGS. 3 and 4, there is shown in more detail the ion source housing 6 and the component parts thereof including the rotary feedthrough 10. The ion source housing 6 includes an upper section 60 of rectangular cross-section welded to a lower pot member 62 of rectangular cross-section which is secured to an adaptor plate 16. One end of the upper section 60 has a circular end-piece 10 which forms the rotary feedthrough.

The lower part of the housing 62 includes an isolation valve which is shown in more detail in FIG. 4 as comprising a hydraulic cylinder 70 mounting a piston 72 which extends into lower housing part 62 and is secured to an isolation plate 74 by means of articulated link members 76. In the normal inoperative state of the ion source, the isolation plate 74 is positioned in contact with a lower face 66 of housing part 62. An O-ring seal 78 in plate 74 forms a seal for the ion source housing. This is shown at the lefthand side of FIG. 4 whereas on the righthand side of FIG. 4 the isolation plate member 74 is shown in a lower position in which the ion source housing communicates with the interior of the vacuum chamber.

In operation, when it is desired to commence ion beam implantation, the hydraulic cylinder is actuated so as to pull piston 72 to the right as shown in FIG. 4. Initial movement of piston 72 causes link members 76 to rotate to the left with a consequent lowering of plate 74 from face 66 whereby the interior of the housing of the ion source communicates with the interior of the vacuum chamber. Further movement of piston 72 to the right moves the isolation plate 74 completely from aperture 68 in face 66 so that plate 74 does not interfere with operation of the ion source.

Referring now to FIGS. 3 and 4, the ion source will be described in more detail. A suppressor electrode is provided which acts as a grid to repel electrons within the vacuum chamber travelling towards the high intensity field developed in the ion source. This suppressor electrode is supplied at approximately 500 volts DC and is formed as a rectangular ring within the lower part of the housing, one arm of the ring being shown at 80, and a further arm being shown at 82 as being mounted on the end of isolation plate 74.

An extractor electrode 20 is provided formed as an arcuate plate member having a slot 22 running along its length and being suspended at its lefthand end by means of a rotary coupling comprising a shaft member 204 journalled by bearings 206 in a housing 208 which is connected to the side wall of housing part 60.

Referring to FIG. 3A, the ion source comprises a graphite tube electrode 24 and a pair of parallel tungsten electrodes 28. These electrodes are interconnected by a metallic conductive flange member 100 at the lefthand end and by a coupling portion 102 at the righthand end. The coupling portion 102 includes a metallic member 104 mounted in an insulative member 105, member 104 having a recess 106 to receive the end of a stainless steel member 108 which carries gas and electrical power to the ion source as will be described below. The graphite tube 24 is fastened to an electrically conductive tube member 110 which is connected by means of a screw thread 112 to an end of a metal ring member 114 which is in turn fastened to a ceramic insulator 116 which forms a tube member of the coupling between the ion source and the flexible cable. It will thus be seen for maintenance purposes that the ion source may be bodily disconnected from the rotary feedthrough simply by unscrewing the ion source from the threaded connection 112.

The rotary feedthrough as shown in FIG. 3B will now be described in more detail. The rotary feedthrough 10 comprises a fixed bearing member 64 fastened to casing 60 and an inner rotatable ring member 67 journalled on bearings 66. Mounted within ring member 67 is the ceramic insulating member 116 having a radial flange 118 which seats within ring member 67. A seal 120 is provided around flange 118 and a further seal 122 is provided between parts 67, 69 of the rotary feedthrough to ensure an airtight seal.

A two-part sleeve member, 130, 132 is mounted over the end of the cable and comprises an inner part which extends to the end of the cable and has an end piece 134, and an outer piece 130 which is secured by means of a lock nut 136 to the end of the rotary feedthrough by a threaded connection 138. The outer end of the sleeve piece 130 is secured to the corrugated outer plastics sleeve 46. The purpose of the insulating two part sleeve fitting over the end of the cable and extending through the rotary feedthrough is to prevent risk of voltage breakdown occurring at the rotary feedthrough.

A brass tube 140 extends into the end of the cable along the inner surface of the outer co-axial tube 42. This brass tube is electrically connected with the graphite electrode 24 at one end and with the copper braid 40 around the inner tube 36 of the cable at the other end. The electrical connection with the graphite electrode 24 is achieved by an electrically conductive ring 236 secured to the end of the brass tube which is connected via a compression spring 238 to electrically conductive ring member 114 which is in turn electrically coupled to the graphite electrode 24.

The other end of the brass tube has an electrically insulating tube member 142 jammed therein by means of radial flanges 144 and the braid 40 of the cable is secured to leaf springs 146 which make electrical contact with the end of the tube.

An inner stainless steel tube 108 is secured within the inner tube member 36 of the flexible cable in order to enable gas flow through the rotary feedthrough and to supply high voltage electrical power to the ion source. Stainless steel tube member is in two parts, 150 and 152, part 150 terminating in a head member 152 which has O-ring seals 54 which seal stainless steel part 150 to stainless steel part 152 when part 150 is inserted within part 152. Part 152 has a narrowed end catheter portion 156 which is inserted into the end of the tube member 36 as a force fit in order to permit gas to flow therethrough. In addition electrical conductor 38 is welded to the end of the tube part 156 so that electrical power is conducted along stainless steel tube member 108. Since the other end of tube member 108 is lodged in an electrically conductive end piece 104, this enables electrical power to be conducted to the tungsten electrodes 28.

The other end of the flexible cable is as is shown in FIG. 5 connected to the HT supply by means of a feedthrough which is generally similar to the feedthrough shown in FIG. 3B. Similar parts will be indicated by similar reference numerals. The main difference is that the feedthrough is not rotatable but comprises a body member 200 secured to the wall 202 of the HT supply tank and an inner member 204 has a lock nut 206 threaded thereon in order to secure the two-part sleeve 130, 132 thereto. The brass tube 140 is electrically coupled to a terminal 210 for the return conductor high voltage power supply. The stainless steel tube 108 is electrically connected with a terminal 212 which supplies the high voltage transmission line of the power supply. Tube 108 is bent into a U shape as shown at 214 and is coupled to a needle valve 216 for the supply of nitrogen gas into the tube.

We claim:

1. Ion implantation apparatus comprising a vacuum chamber and an ion source, the ion source being moveable so as to enable ions to be directed onto a stationary target from a plurality of different directions, wherein the ion source in use is coupled to a flexible cable supplying gas and a high tension thereto, and wherein the end of the flexible cable remote from the ion source is coupled to a high tension supply and to a gas supply, a valve being provided to regulate the flow of gas; the valve is connected to the high tension supply so that in use the valve may be maintained at high tension.

2. Apparatus according to claim 1, wherein the flexible cable comprises a tube member bearing an electrical conductor, the tube member being adapted in use to carry a flow of gas in contact with the electrical conductor, and the electrical conductor in use is maintained at high tension.

3. Apparatus according to claim 2, wherein the flexible cable comprises first and second tube members, the first tube member being disposed within the second tube member; the first tube member is coupled to gas supply, is adapted in use to support a flow of gas to the ion source, and bears a transmission and a return conductor for conducting electrical power at high voltage to the ion source; and the second tube member bears an earth conductor and provides insulation between the earth conductor and transmission and return conductors.

4. Apparatus according to claim 3, wherein the transmission conductor is carried within the first tube member, and the return conductor is carried on the outside of the first tube member braided thereon.

5. Apparatus according to claim 3, wherein the flexible cable further comprises an outer plastic sleeve.

6. Apparatus according to claim 3, further comprising at least one coupling; the or each coupling comprising a third tube member adapted to receive as a sliding fit an end of the flexible cable, and a fourth tube member adapted for insertion within an end of the gas-carrying tube member so as to make an electrical and gaseous connection with the flexible cable.

7. Apparatus according to claim 6, wherein the ion source is mounted in use in a housing on the outside of the vacuum chamber and a coupling is provided between the ion source housing an an end of the flexible cable.

8. Apparatus according to claim 7, wherein the ion source is mounted on the third tube member of the coupling and the third tube member is rotatable relative to the ion source.

9. Apparatus according to claim 6, wherein the ion source is mounted in use in a housing on a mobile arm within the vacuum chamber; the flexible cable is provided in two lengths, a first length extending from the high tension supply to the vacuum chamber wall and the second length extending from the vacuum chamber wall to the ion source housing; and couplings are provided between one end of each length of flexible cable and the vacuum chamber wall, and between an end of the second length of flexible cable and the ion source housing.

10. Apparatus according to claim 6, wherein a coupling is provided between the high tension supply and an end of the flexible cable.

11. Apparatus according to claim 1, wherein the ion source is mounted within the vacuum chamber on a mobile arm.

12. Apparatus according to claim 2, wherein the mobile arm is a robotic arm.

* * * * *